(12) United States Patent
Usami et al.

(10) Patent No.: US 10,857,783 B2
(45) Date of Patent: Dec. 8, 2020

(54) IMAGE EXPOSURE DEVICE

(71) Applicant: FUJIFILM Corporation, Tokyo (JP)

(72) Inventors: Yoshihisa Usami, Kanagawa (JP); Shinichiro Sonoda, Kanagawa (JP); Hirotoshi Yoshizawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/848,853

(22) Filed: Apr. 15, 2020

(65) Prior Publication Data
US 2020/0238684 A1    Jul. 30, 2020

Related U.S. Application Data (63) Continuation of application No. PCT/JP2018/037049, filed on Oct. 3, 2018.

(30) Foreign Application Priority Data

Nov. 7, 2017    (JP) .................................. 2017-214563

(51) Int. Cl.
*B41F 17/00* (2006.01)
*G02B 27/09* (2006.01)
*G02B 27/30* (2006.01)

(52) U.S. Cl.
CPC .......... *B41F 17/00* (2013.01); *G02B 27/0988* (2013.01); *G02B 27/30* (2013.01); *G02B 2207/123* (2013.01)

(58) Field of Classification Search
CPC ..... B41F 17/00; G02B 27/0988; G02B 27/30; G02B 2207/123; G03F 7/7035; G03F 7/70391

USPC ...................................................... 355/19, 78
See application file for complete search history.

(56) References Cited

U.S. PATENT DOCUMENTS

| | | | |
|---|---|---|---|
| 2005/0206804 A1* | 9/2005 | Hara ................. | G02F 1/133504 349/62 |
| 2012/0013961 A1* | 1/2012 | Minabe ................. | G03G 15/04 359/3 |
| 2015/0138526 A1* | 5/2015 | Degani ................. | G02B 5/005 355/77 |

FOREIGN PATENT DOCUMENTS

| | | | | |
|---|---|---|---|---|
| JP | 2001092016 A | * | 4/2001 | |
| JP | 2004109615 A | * | 4/2004 | |
| JP | 2019202449 A1 | * | 11/2019 | ............. B41J 2/445 |
| WO | WO-2019059168 A1 | * | 3/2019 | ............. B41J 2/00 |
| WO | WO-2019059176 A1 | * | 3/2019 | ............. G03B 27/32 |
| WO | WO-2019093038 A1 | * | 5/2019 | ............. G03B 27/32 |

(Continued)

*Primary Examiner* — Colin W Kreutzer
(74) *Attorney, Agent, or Firm* — JCIPRNET (57) ABSTRACT

An image exposure device includes an image display device having pixels, a photosensitive recording medium support portion that supports a photosensitive recording medium for recording an image of the image display device in a state in which an exposure surface of the photosensitive recording medium faces the image display device, a louver film that is provided between the image display device and the photosensitive recording medium support portion, and in which light transmitting portions that transmit light and light shielding portions that block light are alternately arranged in a first direction, and light transmitting portions that transmit light and light shielding portions that block light are alternately arranged in a second direction, and a protective layer that is provided on the louver film on a side of the photosensitive recording medium support portion.

20 Claims, 9 Drawing Sheets

(56) References Cited

FOREIGN PATENT DOCUMENTS

WO    WO-2019187751 A1 * 10/2019 ............. G03B 27/32

* cited by examiner

IMAGE EXPOSURE DEVICE

CROSS-REFERENCE TO RELATED APPLICATIONS

This application is a Continuation of PCT International Application No. PCT/JP2018/037049 filed on Oct. 3, 2018, which claims priority under 35 U.S.C § 119(a) to Japanese Patent Application No. 2017-214563 filed on Nov. 7, 2017. Each of the above applications is hereby expressly incorporated by reference, in its entirety, into the present application.

BACKGROUND OF THE INVENTION

1. Field of the Invention

The present invention relates to an image exposure device and particularly to an image exposure device that selects, in light radiated from a light source, light parallel to a photosensitive recording medium for recording an image and carries out exposure using the light.

2. Description of the Related Art

For the exposure of photographs, photomasks, or the like, optical systems for projecting that are optical systems of an imaging system are being used. However, in the case of the optical systems for projecting, an optical system such as a lens is required between an image and a photosensitive material, and a large volume becomes necessary. In the case of exposing a pattern of a semiconductor or the like using a photomask, the photomask is brought into close contact with or almost brought into close contact with the photosensitive material. At this time, a space or a protective plate is provided between the photosensitive material and a mask pattern, and parallel light is projected, thereby preventing the blurring of the image.

In addition, in light radiated from a light source, light radiated parallel to the photosensitive material is used to irradiate and expose the photosensitive material, thereby preventing the blurring of the image. For example, in U.S. Pat. No. 9,126,396B, an optical fiber array or the like is installed between a photosensitive material and a light-emitting image such as an electron display, and, in light radiated from the display toward the photosensitive material, only light parallel to the photosensitive material from the display is selected (collimated) and radiated to the photosensitive material, whereby the photosensitive material can be exposed without blurring the light-emitting image.

SUMMARY OF THE INVENTION

However, in a printing device described in U.S. Pat. No. 9,126,396B, an optical system becomes large, and thus the entire device increases in size, which creates a desire for decreasing the size of the device.

In addition, since the optical fiber array has a structure in which thin optical fibers are bundled, a problem has occurred in that moire occurs between the pixel pitch of the display and the pitch of the optical fibers. Moreover, it has been difficult to reduce the numerical aperture (NA). In a fiber array plate, the NA was at least 0.43, meaning that light at an angle of about ±25 degrees was transmitted, and thus image blurring also occurred.

In order to increase the resolution, the optical fiber pitch is narrowed, and the optical fiber array is brought into close contact with a recording medium to perform exposure. However, in a case where many images are continuously printed, a part of the optical fiber array falls off, and this causes image defects.

Moreover, in the fiber array plate, the transmittance significantly differs depending on the wavelength due to the wavelength dispersion of the refractive index. For example, there is a 3 or more times difference in transmittance between blue and red.

The present invention has been made in consideration of the above-described circumstance, and an objective of the present invention is to provide an image exposure device capable of recording a favorable image using only light parallel to a photosensitive recording medium from an image display device and capable of decreasing the size of the device. Another objective of the present invention is to provide an image exposure device capable of narrowing an angle at which light radiated from a light source is transmitted, preventing the occurrence of image blurring, preventing damage to a collimator, and preventing a defect in an image to be exposed.

In order to attain the above-described objective, the present invention provides an image exposure device comprising an image display device that has pixels, a photosensitive recording medium support portion that supports a photosensitive recording medium for recording an image of the image display device in a state in which an exposure surface of the photosensitive recording medium faces the image display device, a louver film that is provided between the image display device and the photosensitive recording medium support portion, and in which light transmitting portions that transmit light and light shielding portions that block light are alternately arranged in a first direction on a plane parallel to a surface where the pixels of the image display device are arrayed, and light transmitting portions that transmit light and light shielding portions that block light are alternately arranged in a second direction perpendicular to the first direction on the plane parallel to the surface where the pixels of the image display device are arrayed, and a protective layer that is provided on the louver film on a photosensitive recording medium support portion side.

According to the present invention, by using the louver film in which the light transmitting portions and the light shielding portions are alternately arranged in the first direction and the second direction perpendicular to the first direction, it is possible to block, in light radiated from the pixels, obliquely radiated light that is not parallel to a direction toward the photosensitive recording medium by the light shielding portions. Accordingly, in light radiated from the image display device, only light parallel to the direction toward the photosensitive recording medium can be radiated to the photosensitive recording medium. An image can be recorded on the photosensitive recording medium using only the light parallel to the photosensitive recording medium, and thus it is possible to form a favorable image that is not blurred. In addition, only parallel light is selected using the louver film, whereby a large optical system can be omitted, and the size of the device can be decreased.

In addition, by providing the protective layer on the louver film on the photosensitive recording medium support portion side, the louver film can be prevented from being damaged by bringing the protective layer into close contact with the photosensitive recording medium during exposure.

In addition, the second direction perpendicular to the first direction does not mean merely a direction at an angle of 90° with respect to the first direction, and may deviates from 90° as long as the effect of the present invention is achieved.

In a different aspect of the present invention, the louver film is preferably formed by laminating a first layer in which the light transmitting portions and the light shielding portions are alternately arranged only in the first direction and a second layer in which the light transmitting portions and the light shielding portions are alternately arranged only in the second direction.

In this aspect, a configuration in which the light transmitting portions and the light shielding portions are alternately arranged in the first and second directions is shown. A lamination structure of the first layer and the second layer is provided. In the first layer, the light transmitting portions and the light shielding portions are alternately arranged only in the first direction, and in the second layer, the light transmitting portions and the light shielding portions are alternately arrayed only in the second direction. Accordingly, a louver film in which the light transmitting portions and the light shielding portions are alternately arranged in the first and second directions as a whole can be provided.

In a different aspect of the present invention, it is preferable that the light shielding portions of the first layer are formed by arranging a plurality of shielding members at intervals along the second direction, and the light shielding portions of the second layer are formed by arranging a plurality of shielding members at intervals along the first direction.

In this aspect, an aspect of the light shielding portions is shown. Even in a case where a plurality of shielding members constituting the light shielding portions of the first layer are arranged at intervals along the second direction, and a plurality of shielding members constituting the light shielding portions of the second layer are arranged at intervals along the first direction, oblique light radiated from the pixels can be blocked by the light shielding portions, and only light parallel to the photosensitive recording medium can be used.

In a different aspect of the present invention, the protective layer preferably has a thickness of 0.1 µm to 500 µm.

In a different aspect of the present invention, the protective layer preferably has a nonadhesive property on the photosensitive recording medium support portion side.

The nonadhesive property means that the photosensitive recording medium falls in a case where the photosensitive recording medium is placed on a surface of the protective layer on the photosensitive recording medium support portion side and the protective layer is inclined by 90 degrees.

In a different aspect of the present invention, a pitch of the light shielding portions of the louver film is preferably 40% to 95%, or 105% to 195% of a pitch of the pixels.

In a different aspect of the present invention, the louver film preferably has a transmittance of light of 650 nm radiated from the pixels in a range of 50% to 200% of a transmittance of light of 450 nm radiated from the pixels.

According to this aspect, it is possible to reduce a difference in transmittance between the light of 650 nm and the light of 450 nm radiated from the pixels.

In a different aspect of the present invention, it is preferable that the image display device has the pixels arrayed two-dimensionally, and the image exposure device exposes an entire two-dimensional region of the exposure surface of the photosensitive recording medium at the same time.

In a different aspect of the present invention, it is preferable that the image display device has the pixels arrayed one-dimensionally, and the image exposure device further comprises scanning means for scanning at least any one of the image display device or the photosensitive recording medium supported by the photosensitive recording medium support portion along a direction perpendicular to an array direction of the pixels of the image display device.

In a different aspect of the present invention, it is preferable that the image display device has the pixels arrayed two-dimensionally on a region having a smaller area than the exposure surface of the photosensitive recording medium, and the image exposure device further comprises scanning means for scanning at least any one of the image display device or the photosensitive recording medium supported by the photosensitive recording medium support portion along an array direction of the pixels of the image display device and a direction perpendicular to the array direction of the pixels.

These aspects show aspects of the device that exposes the photosensitive recording medium to an image of the image display device. As an exposure device, the entire surface may be collectively exposed or an image can be recorded in the entire region of the photosensitive recording medium by using an image display device having a smaller area than the exposure surface of the photosensitive recording medium and scanning the image display device.

In a different aspect of the present invention, among exposure ranges by light radiated from the pixels on a location at which the exposure surface of the photosensitive recording medium is supported, adjacent exposure ranges preferably partially overlap each other.

In a different aspect of the present invention, a collimator portion that makes light radiated from the pixels into parallel light is preferably provided between the image display device and the louver film.

In a different aspect of the present invention, the collimator portion preferably includes at least any one of a fiber optic plate or a capillary plate.

According to the image exposure device of the present invention, oblique light radiated from the pixels can be blocked by the light shielding portions arranged alternately with the light transmitting portions in the first and second directions. Accordingly, an image can be printed only with light parallel to the photosensitive recording medium, and a favorable image can be formed. In addition, since the protective layer is provided between the louver film and the photosensitive recording medium, the louver film can be prevented from being damaged even in a case where the photosensitive recording medium is repeatedly exposed. Accordingly, an image defect caused by the damage of the louver film can be prevented.

DESCRIPTION OF THE PREFERRED EMBODIMENTS

Hereinafter, an image exposure device according to an embodiment of the present invention will be described according to the accompanying drawings.

(Image Exposure Device)

Figure 1:
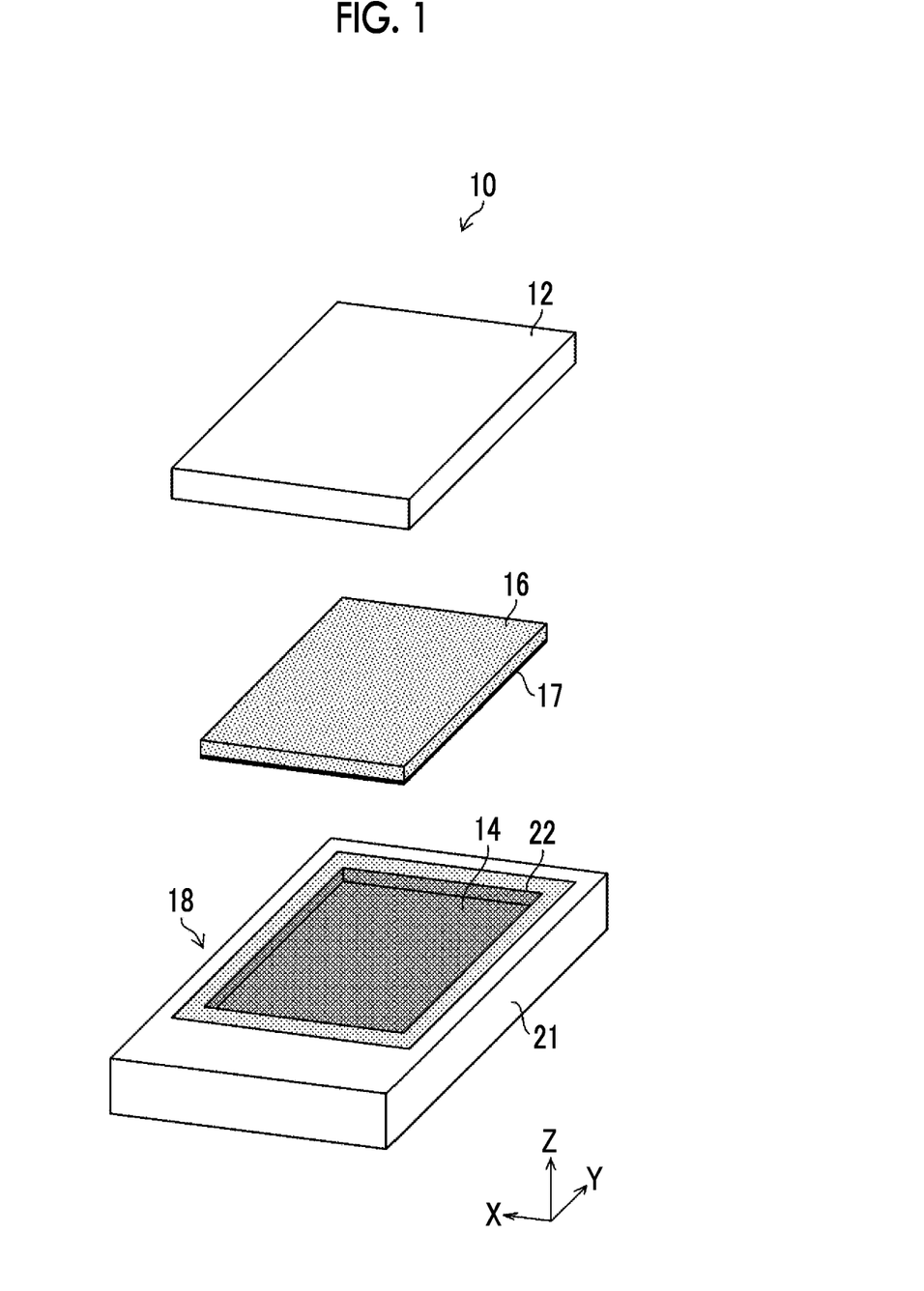
FIG. 1 is an exploded perspective view of an image exposure device.

An image exposure device to which the present invention is applied will be described using FIG. 1 and FIG. 2. FIG. 1 is an exploded perspective view of the image exposure device, and FIG. 2 is a cross-sectional view of the image exposure device.

Figure 2:
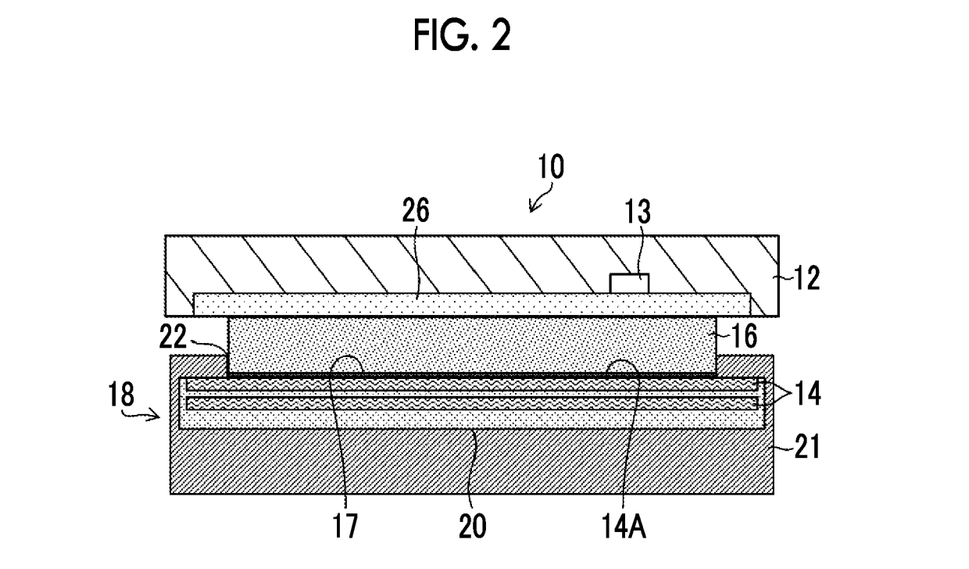
FIG. 2 is a cross-sectional view of the image exposure device.

An image exposure device 10 in FIGS. 1 and 2 has an image display device 12 having pixels 13, a photosensitive recording medium support portion 21 that supports a photosensitive recording medium 14 for recording an image of the image display device 12, a louver film 16 that is provided between the image display device 12 and the photosensitive recording medium support portion 21, and a protective layer 17 that is provided on the louver film 16 on the side of the photosensitive recording medium support portion 21.

[Image Display Device]

As the image display device 12, it is possible to use a portable terminal such as a smartphone or a tablet PC, a liquid crystal display (LCD), a cathode ray tube (CRT), a light emitting diode (LED), a plasma display device, or the like. The image display device 12 includes a plurality of pixels 13 (in FIG. 2, one pixel is shown as an example) for displaying an image. The pixel 13 refers to a minimum unit of color information configuring an image display surface. The image display device 12 has the pixels 13 and is thus capable of displaying an image.

On a surface side on which light is radiated from the image display device 12, a glass window 26 is provided. The glass window 26 is provided to protect the pixels 13 provided in the image display device 12. The glass window 26 preferably has a small thickness to shorten a distance from the pixel 13 to the photosensitive recording medium 14.

The pixel 13 needs to have a function capable of radiating any light from the image display device 12, and a lamp is not essential. The image display device 12 refers, for example, not only to a case where a lamp such as a backlight radiates light as in a liquid crystal display but also to a case where the image display device radiates light on its own as in a light-emitting diode display device.

Figure 8:
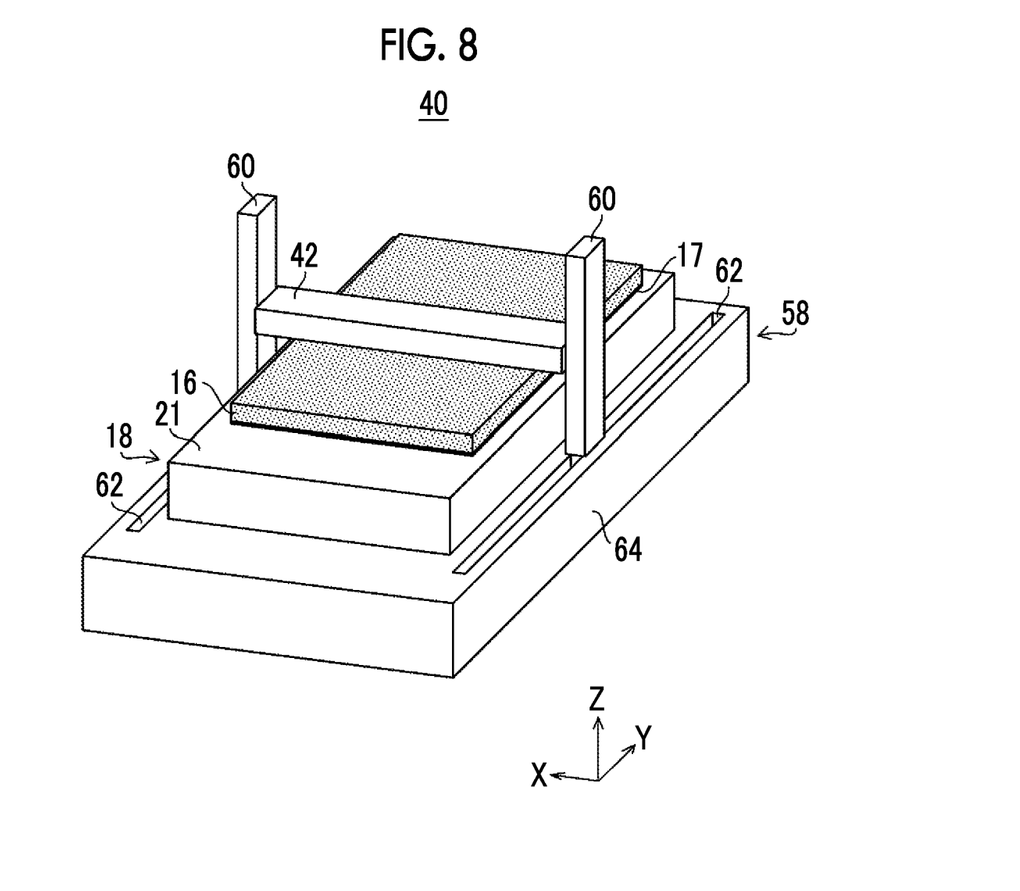
FIG. 8 is a perspective view of an image exposure device of another embodiment.
Figure 9:
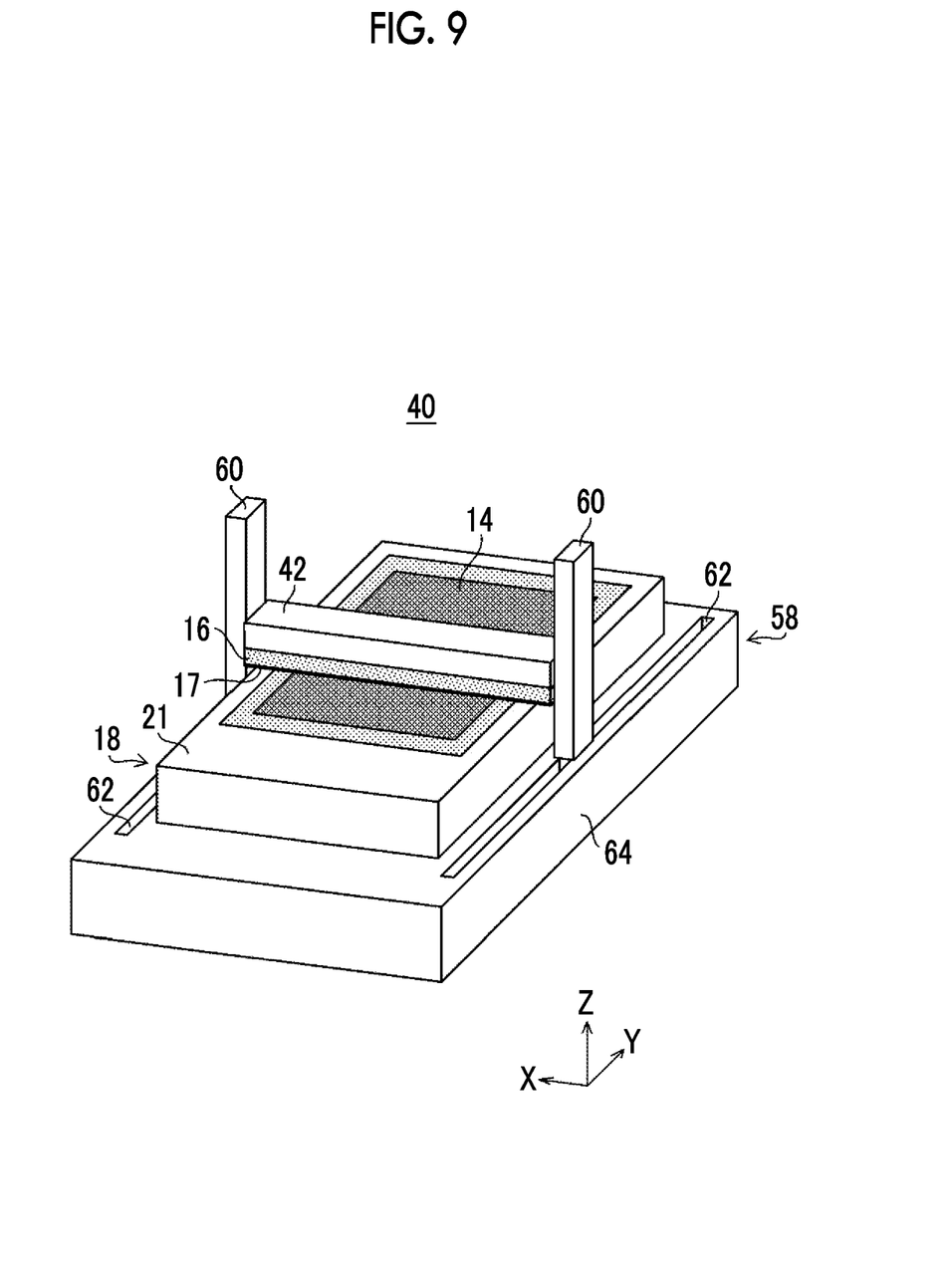
FIG. 9 is a perspective view showing a modification example of the image exposure device of the above another embodiment.

A pixel display surface of the image display device 12 shown in FIGS. 1 and 2 has two-dimensionally arrayed pixels 13. Being two-dimensional means a state in which the pixels extend in X-Y directions. The pixels 13 of the image display device can also be one-dimensionally arrayed as shown in FIGS. 8 and 9.

[Photosensitive Recording Medium Support Portion]

The photosensitive recording medium support portion 21 supports the photosensitive recording medium 14 so that the photosensitive recording medium 14 is disposed at a location facing a surface of the image display device 12 from which light is radiated. The photosensitive recording medium support portion 21 may directly or indirectly support the photosensitive recording medium 14, and the structure thereof is not particularly limited as long as the photosensitive recording medium support portion is capable of supporting the photosensitive recording medium 14.

[Photosensitive Recording Medium]

The photosensitive recording medium 14 has an exposure surface 14A. The photosensitive recording medium 14 is not particularly limited as long as the photosensitive recording medium can be exposed by light radiated from the image display device 12 and an image can be formed thereon. For example, it is possible to use a film pack 18 which is loaded into an instant camera (for example, manufactured by Fujifilm Corporation, Cheki).

The film pack 18 is formed by incorporating the photosensitive recording medium 14 into a case 20. Between a plurality of the photosensitive recording media 14 provided in the case 20, a light-blocking sheet, not shown, is provided, and, due to the light-blocking sheet, only the photosensitive recording medium 14 present on the uppermost surface of the film pack 18 is exposed. As a material used for the photosensitive recording medium 14, for example, photographic sensitive materials such as a negative film, a reversal film, printing paper, and a mono-sheet or peel-apart type instant photographic film can be exemplified.

As shown in FIG. 2, a plurality of the photosensitive recording media 14 is packed in a box-like case 20 having a light-blocking property. In the case 20, an exposure opening 22 through which light radiated from the image display device 12 passes is provided in order to expose the exposure surface 14A of the photosensitive recording medium 14. In addition, on a side opposite to the exposure opening 22, a pressing member (not shown) is provided, and the photosensitive recording medium 14 is pressed toward the exposure opening 22 using the pressing member. Therefore, the photosensitive recording medium 14 is pressed in the circumference of the exposure opening 22, the distance with the image display device 12 becomes close, and a favorable image can be recorded on the photosensitive recording medium 14.

As the case 20, it is possible to use a resin member for a recording material that is used for a variety of recording materials such as a photographic sensitive material, a magnetic recording material, and an optical recording material, and the resin member for a recording material refers to a case, a lid, and an accessory supplemented thereto which are used to contain, pack, coat, protect, transport, store, or support (the form of) the recording material or a variety of members that mount the recording material and exhibit a function.

The photosensitive recording medium 14 after exposure is passed through between delivery rollers (not shown), whereby a pod portion provided in the photosensitive recording medium 14 breaks. In the pod portion, a development process liquid is encapsulated, and the breakage of the pod portion causes the development process liquid to spread in the photosensitive recording medium 14. After one to several minutes elapses, a development process is completed, and an image is formed on the photosensitive recording medium 14.

[Louver Film]

Figure 3:
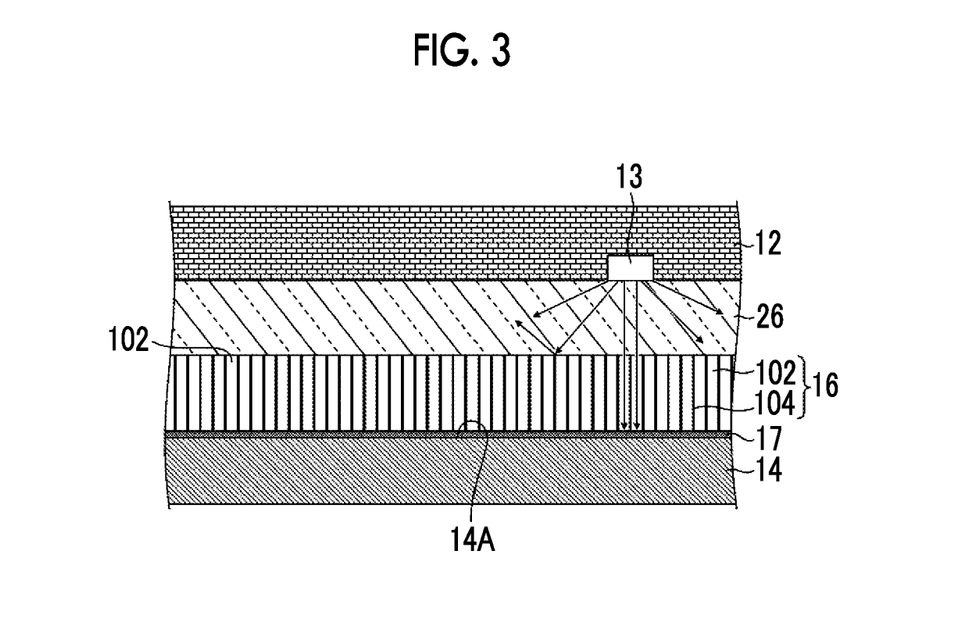
FIG. 3 is a schematic cross-sectional view of the image exposure device for explaining a traveling direction of light.
Figure 4:
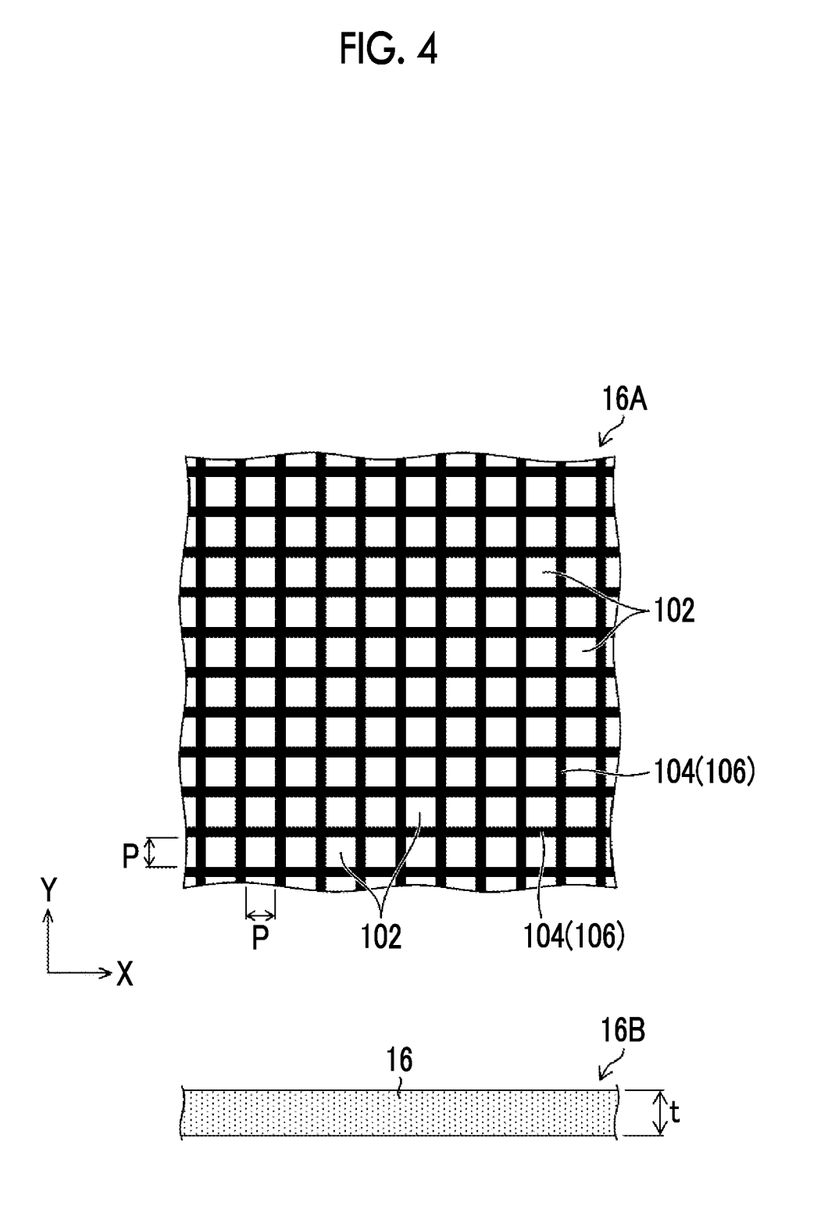
FIG. 4 is a view showing a configuration of a louver film.

FIG. 3 is a schematic cross-sectional view of the image exposure device 10, and illustrates a traveling direction of light radiated from the pixel 13. FIG. 4 is a view showing a configuration of the louver film 16. A reference 16A denotes a planar surface 16A of the louver film 16, and a reference 16B denotes a side surface 16B of the louver film 16. In the louver film 16, light transmitting portions 102 that transmit light and light shielding portions 104 that block light are alternately arranged in a first direction (X direction in the planar surface 16A in FIG. 4) on a plane parallel to the surface where the pixels 13 of the image display device 12 are arrayed, and light transmitting portions 102 that transmit light and light shielding portions 104 that block light are alternately arranged in a second direction (Y direction in the planar surface 16A in FIG. 4) perpendicular to the first direction on the plane parallel to the surface where the pixels of the image display device are arrayed. As described above, in the present embodiment, the light transmitting portions 102 are two-dimensionally arranged, and the light shielding portions 104 are formed in a lattice. Due to such a configuration, in light radiated from the pixel 13 of the image display device 12, only light parallel to the photosensitive recording medium 14 can be caused to reach the exposure surface 14A of the photosensitive recording medium 14 as shown in FIG. 3.

Light radiated from the pixels 13 of the image display device 12 is radiated toward all directions of 180° from the image display surface. The radiated light passes through the glass window 26 provided in the image display device 12 and is incident on the louver film 16. In the light incident on the louver film 16, only light parallel to a straight line connecting the image display device 12 and the photosensitive recording medium 14 can be caused to pass through the light transmitting portions 102 of the louver film 16. In addition, light radiated obliquely with respect to the straight line connecting the image display device 12 and the photosensitive recording medium 14 is blocked by the light shielding portions 104 in the louver film 16. Accordingly, in light radiated from the pixels 13 of the image display device 12, only light parallel to the straight line connecting the image display device 12 and the photosensitive recording medium 14 can be caused to reach the exposure surface 14A of the photosensitive recording medium 14. An image is recorded on the photosensitive recording medium 14 only using parallel light radiated from the image display device 12, whereby a favorable image can be recorded.

The light transmitting portion 102 only needs to be able to transmit light, and can be provided using a glass material, a transparent silicone rubber, or the like. In addition, the light transmitting portions 102 can be provided as cavities, and the louver film 16 can be formed only of the light shielding portions 104. The light shielding portion 104 may be a light absorbing member that absorbs light, or a light reflecting member that reflects light. A light shielding member 106 constituting the light shielding portion 104 can be provided using a colored resin material such as a black silicone rubber. Further, as the material that absorbs light, a neutral density filter (ND filter) can be used. The ND filter means a filter having a neutral optical density, and can evenly absorb light in a wavelength region used for exposure without giving an influence on the wavelength (absorbance of 50% to 99.999%; light transmittance of 0.001% to 50%).

Figure 5:
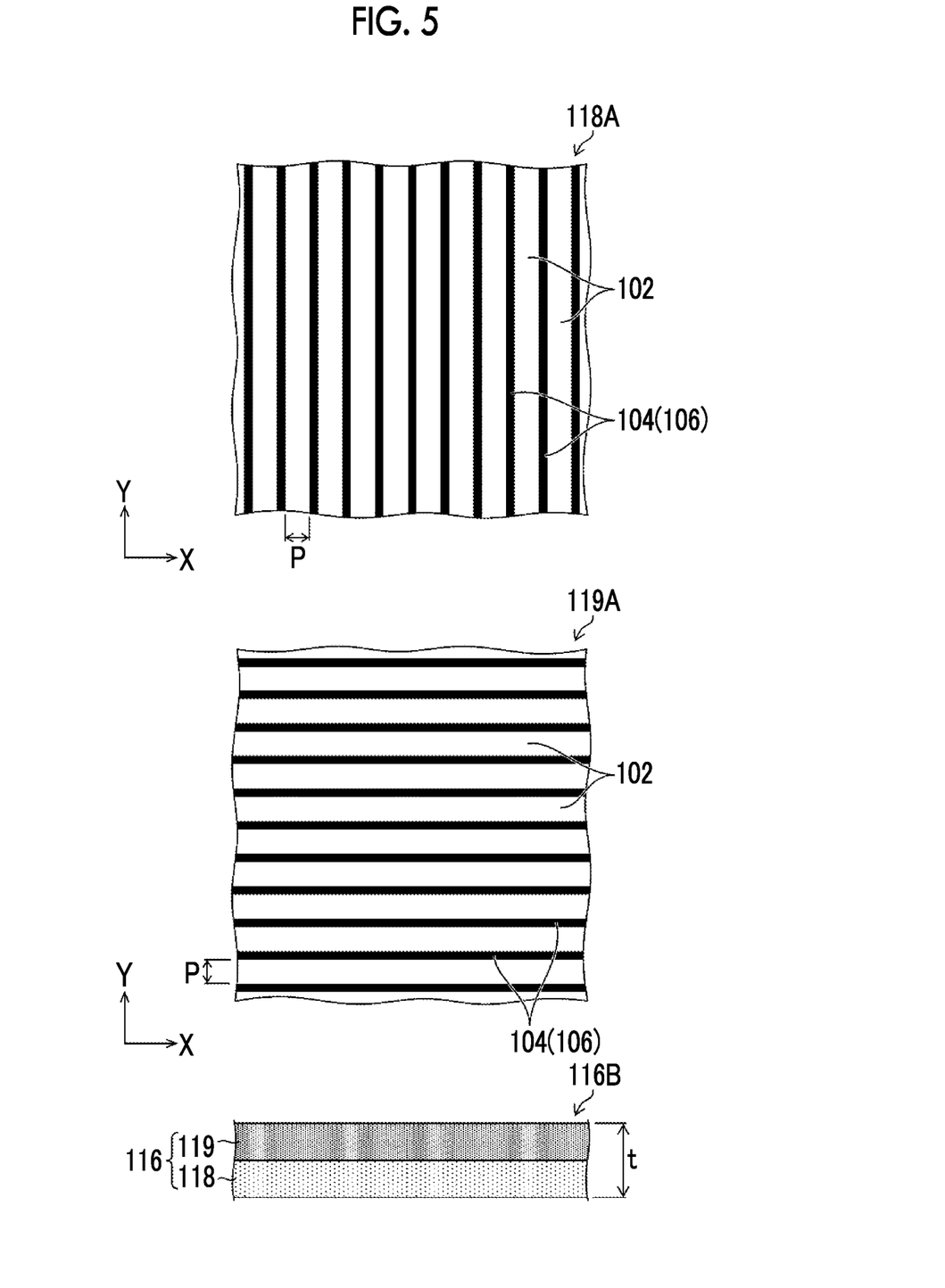
FIG. 5 is a view showing another configuration of the louver film.
Figure 6:
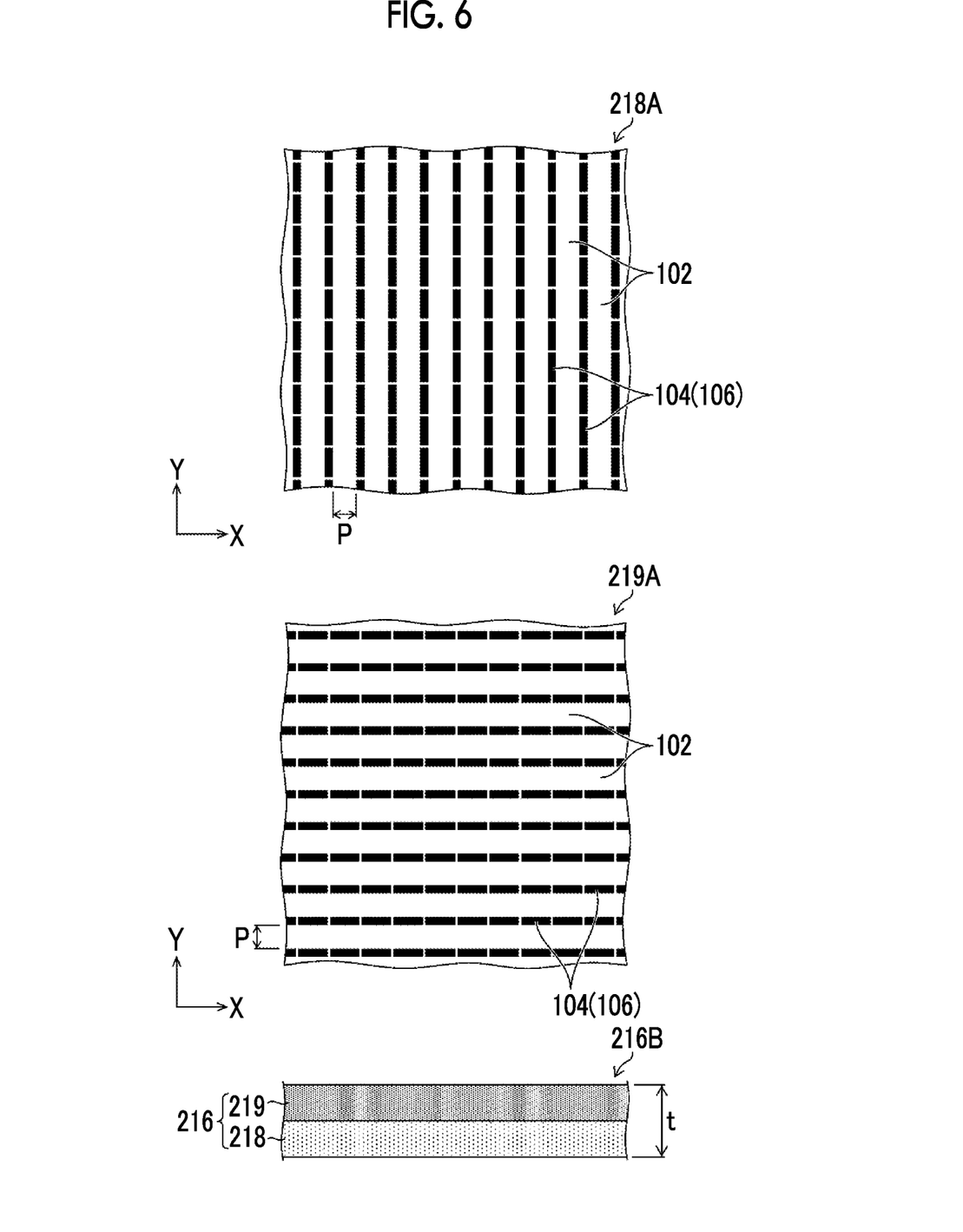
FIG. 6 is a view showing still another configuration of the louver film.

FIGS. 5 and 6 are views showing a configuration of a louver film having another configuration. The louver film 16 shown in FIG. 4 is formed of one layer as shown in the side surface 16B, and the light transmitting portions 102 and the light shielding portions 104 are alternately arranged in the one layer in the first and second directions. Thus, a louver film 16 with a two-dimensional arrangement is formed.

A louver film 116 shown in FIG. 5 is formed of two layers of a first layer 118 and a second layer 119. A reference 116B denotes a side surface of the louver film 116, a reference 118A denotes a planar surface of the first layer 118, and a reference 119A denotes a planar surface of the second layer 119. As shown in the planar surface 118A of the first layer 118, the first layer 118 has light transmitting portions 102 and light shielding portions 104 alternately arranged only in a first direction (X direction in the planar surface 118A in FIG. 5). In the second layer 119, light transmitting portions 102 and light shielding portions 104 are alternately arranged only in a second direction perpendicular to the first direction (Y direction in the planar surface 119A in FIG. 5). The two-dimensional louver film 116 can be formed by laminating the first layer 118 and the second layer 119.

A louver film 216 shown in FIG. 6 is a modification example of the louver film 116 shown in FIG. 5. A reference 216B denotes a side surface of the louver film 216, a reference 218A denotes a planar surface of a first layer 218, and a reference 219A denotes a planar surface of a second layer 219. Light shielding portions 104 of the first layer 218 provided along a second direction (Y direction in the planar surface 218A in FIG. 6) are formed by arranging a plurality of light shielding members 106 at a predetermined interval in the second direction. Similarly, in the second layer 219, light shielding portions 104 provided along a first direction (X direction in the planar surface 219A in FIG. 6) are formed by arranging a plurality of light shielding members 106 at a predetermined interval in the first direction. As described above, even in a case where the light shielding members 106 are arranged at a predetermined interval, the two-dimensional louver film 216 can be formed by laminating the first layer 218 and the second layer 219. Accordingly, in a case where the light shielding portions 104 are formed by providing the light shielding members 106 at intervals, the manufacturing can be facilitated.

As in the louver films 116 and 216 shown in FIGS. 5 and 6, in a case where a plurality of layers is prepared and a layer in which light transmitting portions and light shielding portions are alternately arranged in one direction is laminated, a two-dimensional louver film can be formed. Even in a case where the two-dimensional louver film is formed with a plurality of layers, the same effect as that of a louver film formed of one layer can be obtained.

A pitch P of the light shielding portions 104 of the louver film, that is, a width of the light transmitting portion 102 is preferably 40% to 95%, or 105% to 195% of a pitch of the pixels 13 of the image display device 12. The pitch P is more preferably 50% to 90%, or 110% to 190%, and even more preferably 60% to 80%, or 120% to 180%. In a case where the pitch P of the light shielding portions 104 is set to be in the above-described range with respect to the pitch of the pixels 13, it is possible to block, in light radiated from the pixels 13, obliquely radiated light, and to transmit only light parallel to the photosensitive recording medium 14. Accordingly, a favorable image can be formed. Particularly, by setting the pitch P of the light shielding portions 104 and the pitch of the pixels 13 to magnifications other than integral multiples, it is possible to suppress the occurrence of moire in an image to be formed. Specifically, the pitch P of the light shielding portions 104 is preferably 10 µm to 200 µm, more preferably 30 µm to 150 µm, and even more preferably 50 µm to 100 µm. The pitch of the pixels 13 refers to the distance between the plurality of adjacent pixels 13 arrayed on the image display device 12. In a case where the pitch of the pixels 13 is set to 200 µm or less, the impression of an image to be printed as a natural image can be enhanced. The pitch of the pixels 13 is preferably 150 µm or less, more preferably 125 µm or less, and even more preferably 85 µm or less.

The light shielding portions 104 may be arranged so that a difference is provided between an angle between the XY axes of the pixels serving as a reference for the arrangement of the pixels 13 and an angle between the XY axes of the louver serving as the reference for the arrangement of the light transmitting portions 102 and the light shielding portions 104 of the louver film. Moire is suppressed in a case where the light shielding portions are arranged so that a difference is provided between the angle between the XY axes of the pixels 13 and the angle between the XY axes of the louver. The difference between the angles is preferably 1 to 45 degrees. The difference between the angles is more preferably 5 to 40 degrees, and even more preferably 10 to 30 degrees. In this case, the pitch of the louver is calculated based on the pitch along the XY axes of the pixels, and the light shielding portions 104 are arranged so that the calculated pitch is in the preferable range of the pitch P of the light shielding portions 104 described above. Specifically, in a case where the difference between the angle between the XY axes of the pixels and the angle between the XY axes of the louver is 30 degrees, and the pitch P of the light shielding portions 104 is 100 μm along the XY axes of the louver, the pitch of the pixels 13 is calculated as 100/cos(30 degrees) =115 μm along the XY axes of the pixels.

The thickness t of the louver film is preferably 0.1 mm to 4 mm, more preferably 0.5 mm to 3 mm, and even more preferably 1 mm to 2 mm. By increasing the thickness t of the louver film, oblique light at a small angle with respect to parallel light can be blocked. In a case where the thickness t of the louver film is increased, a formed image is likely to be blurred. Therefore, the thickness t of the louver film is preferably in the above-described range. In a case where the louver film is formed of one layer as shown in FIG. 4, the thickness t of the louver film corresponds to the thickness of the one layer, and in a case where the louver film is formed of a plurality of layers such as two layers of a first layer and a second layer as shown in FIGS. 5 and 6, the thickness t of the louver film corresponds to the total thickness of the plurality of layers.

In addition, by controlling an aspect ratio (thickness t [μm]/pitch P [μm]) that is determined by the thickness t of the louver film and the pitch P of the light shielding portions 104, the angle of the oblique light radiated from the pixel 13 can be controlled. A favorable image can be formed by adjusting the aspect ratio within a desired range. The aspect ratio is preferably 5 or more, more preferably 10 or more, and even more preferably 20 or more. For example, in a case where the louver film is formed of two layers as shown in FIGS. 5 and 6, the thickness of each layer may be 1.5 mm, the thickness of the louver film may be 3 mm, and the pitch may be 60 μm.

By using such a two-dimensional louver film, it is possible to limit light at an angle that cannot be limited by a fiber optic plate (hereinafter, also referred to as "FOP"). Accordingly, in a case where the louver film is used, an image can be exposed using only more parallel light.

Furthermore, using the louver film with a two-dimensional arrangement, the wavelength dispersion of the refractive index can be suppressed, and thus a difference in transmittance depending on the wavelength can be suppressed. For example, according to the louver film of the present embodiment, the transmittance of light of 650 nm radiated from the pixel 13 can be adjusted to be in a range of 50% to 200% of the transmittance of light of 450 nm radiated from the pixel 13. That is, a difference between the transmittance of light of 650 nm and the transmittance of light of 450 nm can be suppressed to two or less times. By defining the ratio of the transmittance of light of 650 nm to the transmittance of light of 450 nm, the transmittance of light of 450 nm to 650 nm can be adjusted to be in the above-described range. In a FOP, the transmittance of light of 650 nm and the transmittance of light of 450 nm are different from each other by three or more times. However, by using the two-dimensional louver film, the difference in transmittance depending on the wavelength, that is, the color can be suppressed, and a favorable image can be formed.

[Protective Layer]

Returning to FIGS. 1, 2, and 3, the protective layer 17 is provided on the louver film 16 on the side of the photosensitive recording medium support portion 21. The protective layer 17 protects the louver film 16 in a case where the photosensitive recording medium 14 is brought into contact with the louver film 16 during exposure. There is a concern that the louver film 16 may be damaged by repeated exposure of the image displayed on the image display device 12 to the photosensitive recording medium 14. By providing the protective layer 17, the louver film 16 can be prevented from being damaged.

The protective layer 17 is not particularly limited as long as it is transparent and can transmit light. For example, a plastic plate formed of an acrylic resin, a polycarbonate, a vinyl chloride resin, or the like can be used.

The thickness of the protective layer 17 is preferably 0.1 μm to 500 μm. In a case where the protective layer 17 has a thickness of 0.1 μm or more, it is possible to make moire inconspicuous in addition to the effect of protecting the louver film 16. In addition, it is possible to make an image defect formed based on the defect or the structure of the louver film 16 inconspicuous. In addition, in a case where the protective layer 17 has a thickness of 500 μm or less, a printed image can be prevented from being blurred.

The protective layer 17 preferably has a nonadhesive property on the side of the photosensitive recording medium support portion 21. In a case where an image of the image display device 12 is printed on the photosensitive recording medium 14, the protective layer 17 is brought into close contact with the photosensitive recording medium 14 to perform exposure. As described above, the photosensitive recording medium 14 after exposure is passed between delivery rollers, and the pod portion is broken, thereby spreading the development process liquid and performing a development process. Accordingly, by making the protective layer 17 on the side of the photosensitive recording medium support portion 21 nonadhesive, the photosensitive recording medium 14 after exposure can be slid to the delivery rollers and discharged from the photosensitive recording medium support portion 21. Since the protective layer 17 is adhered to the louver film 16 by an adhesive, it is preferable that no adhesive exists on the surface of the protective layer 17 (the side of the photosensitive recording medium 14). By making the protective layer 17 on the side of the photosensitive recording medium support portion 21 nonadhesive, it is possible to prevent the protective layer 17 and the photosensitive recording medium 14 from being hardly separated from each other after exposure.

<Collimator Portion>

Figure 7:
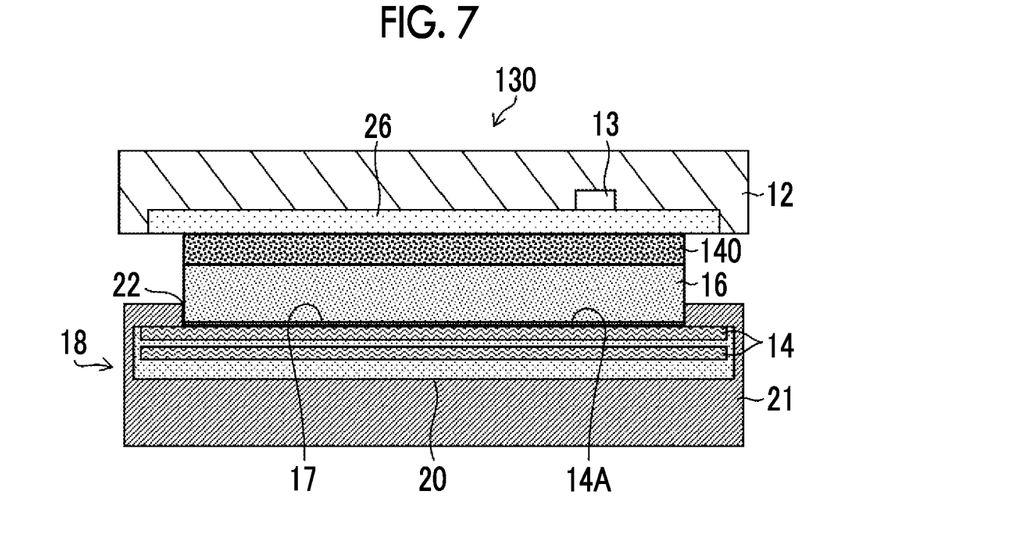
FIG. 7 is a cross-sectional view of an image exposure device having a collimator portion.

FIG. 7 is a cross-sectional view of an image exposure device 130 of another embodiment. In the present embodiment, the image exposure device is different from the image exposure device 10 shown in FIGS. 1 to 3 in that a collimator portion 140 that makes light radiated from the pixels 13 into parallel light is provided between the image display device 12 and the louver film 16 as shown in FIG. 7. In a case where the collimator portion 140 is provided, light at an angle different from that of the louver film 16 can be blocked. Accordingly, since the light reaching the photosensitive recording medium 14 can be made into parallel light only, an image to be printed can be prevented from being blurred.

Examples of the collimator portion 140 include a fiber optic plate and a capillary plate, and at least one of the fiber optic plate or the capillary plate is preferably included. The fiber optic plate is a plate including a plurality of two-dimensionally arrayed optical fibers for transferring light and a glass absorber that absorbs light leaking from the optical fibers. The capillary plate is a plate formed of an aggregate of a plurality of two-dimensionally arrayed capillaries having a hole of several decades of micrometers. By using a fiber optic plate and a capillary plate as the collimator portion 140, it is possible to block light at an angle different from that of the louver film 16 in light radiated from the pixels 13. Accordingly, exposure can be performed only with parallel light as compared with the case where only the louver film 16 is provided.

In the image exposure device 10 shown in FIG. 1, the pixels 13 are two-dimensionally arrayed to extend in the X-Y directions on the image display device 12, and the size of the image display surface of the image display device 12 is set to be larger than the sizes of the louver film 16 and the exposure opening 22 of the film pack 18. The size of the exposure opening 22 is an exposure area of the photosensitive recording medium 14. Therefore, it is possible to expose the entire exposure surface of the photosensitive recording medium 14 to an image output from the image display device 12 at the same time. As a method of exposing an image, first, an image to be exposed is displayed on the image display device 12. Light radiated from the pixels 13 of the image display device 12 passes through the louver film 16 and turns into parallel light. This parallel light reaches the photosensitive recording medium 14 and can be used to expose the entire exposure surface of the photosensitive recording medium 14 at the same time. The image display surface of the image display device 12 is set to be equal to or larger than the exposure area of the photosensitive recording medium 14, whereby it is possible to expose an image without providing scanning means described below. In addition, it is possible to provide room for margin of the installation location accuracy at the time of combining the image display device 12 into the photosensitive recording medium support portion 21.

FIG. 8 is a view showing an image exposure device 40 of another embodiment. The pixels 13 of an image display device 42 in the image exposure device 40 are one-dimensionally arrayed. Being one-dimensional means a state in which the pixels extend in one direction of the X-Y directions. As shown in FIG. 8, the image display device 42 is disposed at a location at which the image display device extends in the X direction, and the plurality of pixels 13 of the image display device 42 is also one-dimensionally arrayed.

The image display device 42 is almost as long as the length in the X direction of the photosensitive recording medium 14. The array of the pixels 13 of the image display device 42 is one-dimensional, and thus the length of the image display device 42 in the Y direction is shorter than the length of the photosensitive recording medium 14. That is, the image display device 42 is smaller than the exposure surface of the photosensitive recording medium 14.

In the image exposure device 40 shown in FIG. 8, the image display device 42 is scanned in a direction (Y direction) perpendicular to the array direction of the pixels 13 in order to expose the photosensitive recording medium 14.

As shown in FIG. 8, the image exposure device 40 includes scanning means 58 for scanning the image display device 42. The scanning means 58 includes support members 60 that support the image display device 42, a support table 64 that supports the film pack 18, and a driving portion (not shown) that is accommodated in the support table 64. The support table 64 includes rails 62, and the driving portion is capable of scanning the support members 60 in the Y direction along the rails 62.

The scanning means 58 scans the image display device 42 in the Y direction, whereby the image display device 42 is capable of sequentially exposing the photosensitive recording medium 14. Light emitted from the pixels of the image display device 42 passes through the louver film 16 and turns into parallel light. This parallel light reaches the photosensitive recording medium 14 and can be used to sequentially expose the photosensitive recording medium.

FIG. 9 is a view showing a modification example of the image exposure device 40 shown in FIG. 8. In the modification example of the image display device 42, the louver film 16 is formed to extend in the X direction like the pixels 13 of the image display device 42.

The scanning means 58 scans the image display device 42 and the louver film 16 in the Y direction that is a direction perpendicular to the array direction of the pixels of the image display device 42, whereby the image display device 42 is capable of sequentially exposing the photosensitive recording medium 14. Light emitted from the pixels of the image display device 42 passes through the louver film 16 and turns into parallel light. This parallel light reaches the photosensitive recording medium 14 and can be used to sequentially expose the photosensitive recording medium.

The case where the image exposure device 40 shown in FIGS. 8 and 9 exposes the photosensitive recording medium while scanning the image display device 42 has been described, but the photosensitive recording medium may be exposed while scanning the photosensitive recording medium 14 as long as the image display device 42 and the photosensitive recording medium 14 can be relatively scanned.

Figure 10:
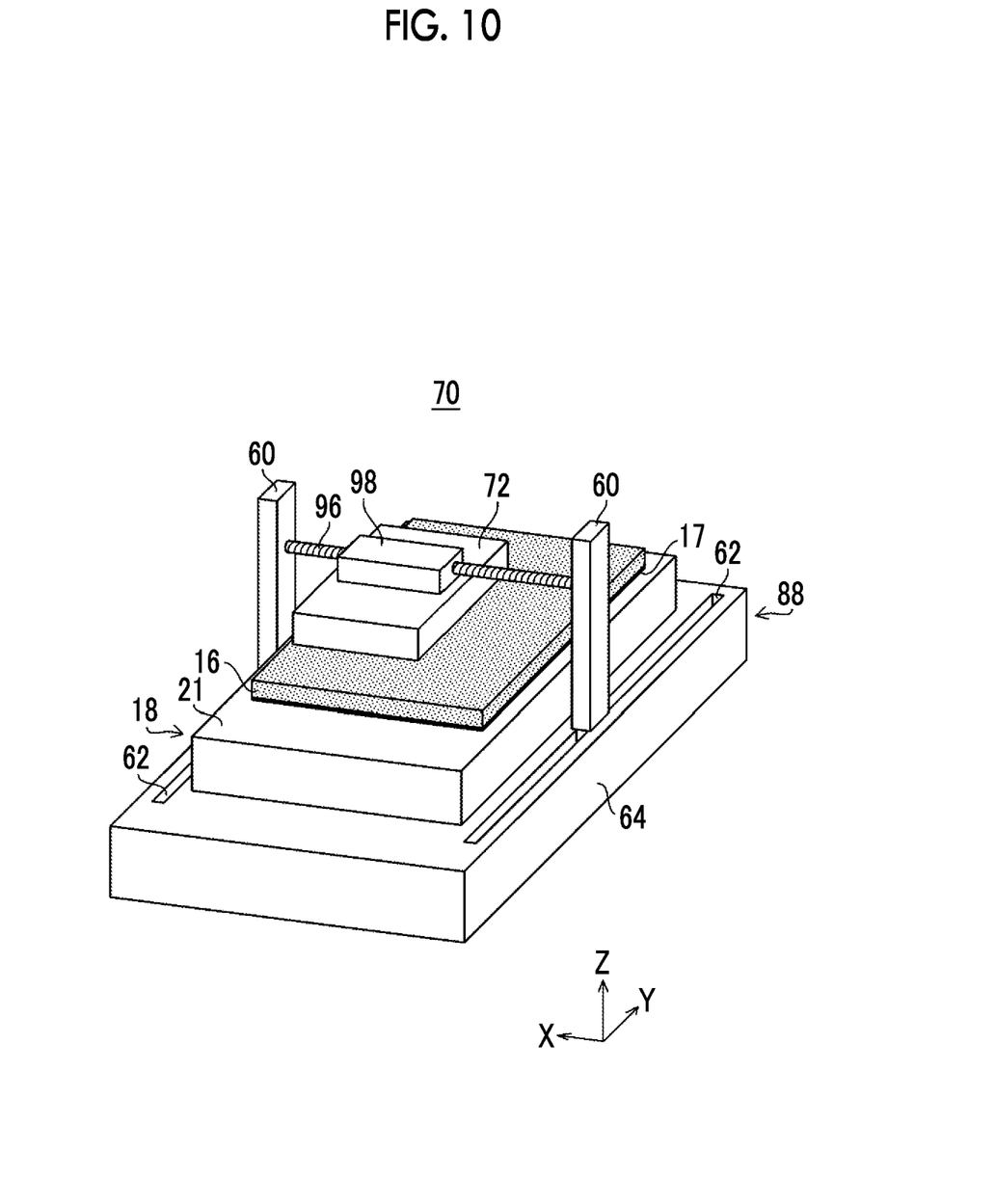
FIG. 10 is a perspective view of an image exposure device of still another embodiment.

FIG. 10 is a view showing an image exposure device 70 of still another embodiment. In the image exposure device 70, the pixels 13 of an image display device 72 are two-dimensionally arrayed in a region smaller than the area of the exposure surface 14A of the photosensitive recording medium 14. The image exposure device 70 includes scanning means 88 that scans the image display device 72 not only in the Y direction but also in the X direction.

The scanning means 88 includes a ball screw 96 and a movement portion 98 including a nut that is engaged with the ball screw 96. The movement portion 98 is capable of moving in the X direction by the rotary motion of the ball screw 96. The movement portion 98 preferably has a holding portion (not shown) for holding the image display device 72. In addition, the movement portion can be caused to move in the Y direction using the same method as in the image exposure device 40.

The scanning means 88 scans the image display device 72 in the X and Y directions, whereby the image display device 72 is capable of sequentially exposing the exposure surface 14A of the photosensitive recording medium 14. Light radiated from the pixels of the image display device 72 passes through the louver film 16 and turns into parallel light. This parallel light reaches the exposure surface 14A of the photosensitive recording medium 14 and can be used to sequentially expose the photosensitive recording medium.

The image exposure device 70 can be effectively applied to the case of exposing the photosensitive recording medium 14 that is larger than the image display device 72.

Figure 11:
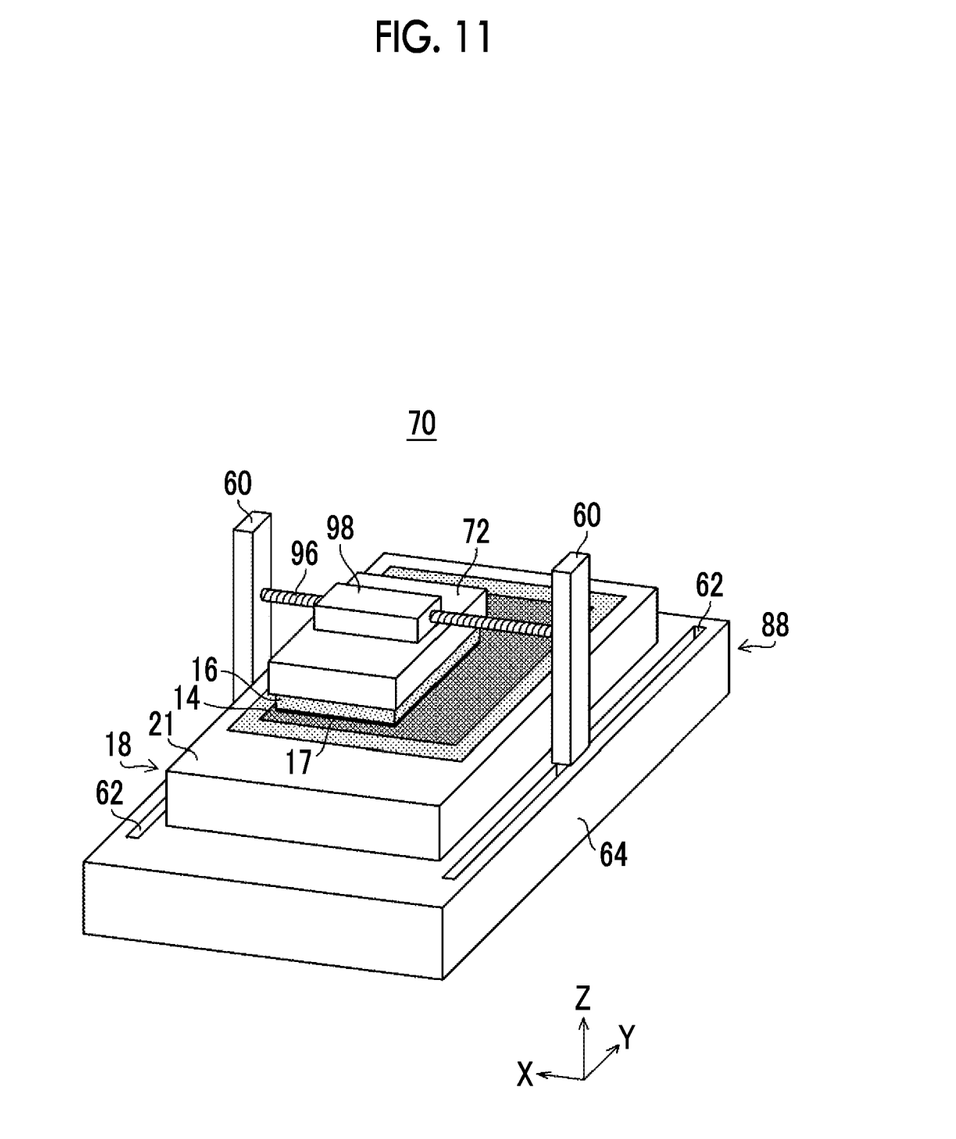
FIG. 11 is a perspective view showing a modification example of the image exposure device of the still another embodiment.

FIG. 11 is a view showing a modification example of the image exposure device 70 shown in FIG. 10. In the modification example of the image exposure device 70, a main surface of the louver film 16 is a two-dimensional region having a smaller area than the photosensitive recording medium 14 like the region in which the pixels 13 of the image display device 72 are arrayed.

The scanning means 88 scans the image display device 72 and the louver film 16 in the X and Y directions, whereby the image display device 72 is capable of sequentially exposing the exposure surface 14A of the photosensitive recording medium 14. Light radiated from the image display device 72 passes through the louver film 16 and turns into parallel light. This parallel light reaches the photosensitive recording medium 14 and can be used to sequentially expose the photosensitive recording medium.

The case where the image exposure device 70 shown in FIGS. 10 and 11 exposes the photosensitive recording medium while scanning the image display device 72 has been described, but the photosensitive recording medium may be exposed while scanning the photosensitive recording medium 14 in the X and Y directions as long as the image display device 72 and the photosensitive recording medium 14 can be relatively scanned.

In the image exposure device 40 and the image exposure device 70, the image display device is smaller than the photosensitive recording medium. Among exposure ranges by light radiated from the pixels of the image display device on a location at which the exposure surface of the photosensitive recording medium is supported, adjacent exposure ranges may partially overlap each other. In the case of preventing the partial overlapping of the exposure ranges, there is a concern that a non-exposure region may be generated on the photosensitive recording medium. A state in which no image is formed on the photosensitive recording medium 14 which is attributed to the non-exposure region is preferably avoided. By performing exposure while partially overlapping adjacent exposure ranges together, it is possible to prevent a non-exposure region from being generated on the photosensitive recording medium 14 and to avoid a state in which no image is formed.

EXPLANATION OF REFERENCES 10, 40, 70, 130: image exposure device
12, 42, 72: image display device
13: pixel
14: photosensitive recording medium
14A: exposure surface
16, 116, 216: louver film
16A: planar surface of louver film
16B, 116B, 216B: side surface of louver film
17: protective layer
18: film pack
20: case
21: photosensitive recording medium support portion
22: exposure opening
26: glass window
58, 88: scanning means
60: support member
62: rail
64: support table
96: ball screw
98: movement portion
102: light transmitting portion
104: light shielding portion
106: light shielding member
118, 218: first layer
118A, 218A: planar surface of first layer
119, 219: second layer
119A, 219A: planar surface of second layer
140: collimator portion
P: pitch of light shielding portions
t: thickness of louver film

What is claimed is:

1. An image exposure device comprising:
an image display device that has pixels;
a photosensitive recording medium support portion that supports a photosensitive recording medium for recording an image of the image display device in a state in which an exposure surface of the photosensitive recording medium faces the image display device;
a louver film that is provided between the image display device and the photosensitive recording medium support portion, and in which light transmitting portions that transmit light and light shielding portions that block light are alternately arranged in a first direction on a plane parallel to a surface where the pixels of the image display device are arrayed, and light transmitting portions that transmit light and light shielding portions that block light are alternately arranged in a second direction perpendicular to the first direction on the plane parallel to the surface where the pixels of the image display device are arrayed; and
a protective layer that is provided on the louver film on a photosensitive recording medium support portion side,
wherein the louver film is formed by laminating a first layer in which the light transmitting portions and the light shielding portions are alternately arranged only in the first direction and a second layer in which the light transmitting portions and the light shielding portions are alternately arranged only in the second direction,
the light shielding portions of the first layer are formed by arranging a plurality of shielding members at intervals along the second direction, and the light shielding portions of the second layer are formed by arranging a plurality of shielding members at intervals along the first direction, and
wherein a total thickness of the first layer and the second layer is 0.1 mm to 4 mm and an aspect ratio that is determined by dividing the total thickness by a pitch of the light shielding portions is 5 or more.

2. The image exposure device according to claim 1, wherein the protective layer has a thickness of 0.1 μm to 500 μm.

3. The image exposure device according to claim 2, wherein the protective layer has a nonadhesive property on the photosensitive recording medium support portion side.

4. The image exposure device according to claim 2, wherein a pitch of the light shielding portions of the louver film is 40% to 95%, or 105% to 195% of a pitch of the pixels.

5. The image exposure device according to claim 1, wherein the protective layer has a nonadhesive property on the photosensitive recording medium support portion side.

6. The image exposure device according to claim 5, wherein a pitch of the light shielding portions of the louver film is 40% to 95%, or 105% to 195% of a pitch of the pixels.

7. The image exposure device according to claim 1, wherein a pitch of the light shielding portions of the louver film is 40% to 95%, or 105% to 195% of a pitch of the pixels.

8. The image exposure device according to claim 1, wherein the louver film has a transmittance of light of 650 nm radiated from the pixels in a range of 50% to 200% of a transmittance of light of 450 nm radiated from the pixels.

9. The image exposure device according to claim 1, wherein the image display device has the pixels arrayed two-dimensionally, and
the image exposure device exposes an entire two-dimensional region of the exposure surface of the photosensitive recording medium at the same time.

10. The image exposure device according to claim 1, wherein the image display device has the pixels arrayed one-dimensionally, and
the image exposure device further comprises scanning means for scanning at least any one of the image display device or the photosensitive recording medium supported by the photosensitive recording medium support portion along a direction perpendicular to an array direction of the pixels of the image display device.

11. The image exposure device according to claim 10, wherein, among exposure ranges by light radiated from the pixels on a location at which the exposure surface of the photosensitive recording medium is supported, adjacent exposure ranges partially overlap each other.

12. The image exposure device according to claim 1, wherein the image display device has the pixels arrayed two-dimensionally on a region having a smaller area than the exposure surface of the photosensitive recording medium, and
the image exposure device further comprises scanning means for scanning at least any one of the image display device or the photosensitive recording medium supported by the photosensitive recording medium support portion along an array direction of the pixels of the image display device and a direction perpendicular to the array direction of the pixels.

13. The image exposure device according to claim 1, further comprising a collimator portion that makes light radiated from the pixels into parallel light between the image display device and the louver film.

14. The image exposure device according to claim 13, wherein the collimator portion includes at least any one of a fiber optic plate or a capillary plate.

15. An image exposure device, comprising
an image display device that has pixels;
a photosensitive recording medium support portion that supports a photosensitive recording medium for recording an image of the image display device in a state in which an exposure surface of the photosensitive recording medium faces the image display device;
a louver film that is provided between the image display device and the photosensitive recording medium support portion, and in which light transmitting portions that transmit light and light shielding portions that block light are alternately arranged in a first direction on a plane parallel to a surface where the pixels of the image display device are arrayed, and light transmitting portions that transmit light and light shielding portions that block light are alternately arranged in a second direction perpendicular to the first direction on the plane parallel to the surface where the pixels of the image display device are arrayed;
a protective layer that is provided on the louver film on a photosensitive recording medium support portion side; and
a collimator portion that makes light radiated from the pixels into parallel light between the image display device and the louver film,
wherein the louver film is formed by laminating a first layer in which the light transmitting portions and the light shielding portions are alternately arranged only in the first direction and a second layer in which the light transmitting portions and the light shielding portions are alternately arranged only in the second direction, and
wherein a total thickness of the first layer and the second layer is 0.1 mm to 4 mm and an aspect ratio that is determined by dividing the total thickness by a pitch of the light shielding portions is 5 or more.

16. The image exposure device according to claim 15, wherein the protective layer has a thickness of 0.1 µm to 500 µm.

17. The image exposure device according to claim 16, wherein the protective layer has a nonadhesive property on the photosensitive recording medium support portion side.

18. The image exposure device according to claim 16, wherein a pitch of the light shielding portions of the louver film is 40% to 95%, or 105% to 195% of a pitch of the pixels.

19. The image exposure device according to claim 15, wherein the protective layer has a nonadhesive property on the photosensitive recording medium support portion side.

20. The image exposure device according to claim 15, wherein a pitch of the light shielding portions of the louver film is 40% to 95%, or 105% to 195% of a pitch of the pixels.

* * * * *